United States Patent [19]

Engstrom

[11] Patent Number: 5,446,259

[45] Date of Patent: Aug. 29, 1995

[54] METHOD FOR PRODUCING OPTO-ELECTRONIC CIRCUIT USING LASER-TRIMMING DEVICE

[75] Inventor: Keith A. Engstrom, Laguna Niguel, Calif.

[73] Assignee: Alps Electric (U.S.A.), Inc., San Jose, Calif.

[21] Appl. No.: 71,152

[22] Filed: Jun. 2, 1993

[51] Int. Cl.⁶ .............................................. B23K 26/00
[52] U.S. Cl. .............................. 219/121.69; 338/195; 29/593; 345/165
[58] Field of Search ...................... 219/121.68, 121.69; 345/164, 165; 250/221; 29/593, 847; 338/195

[56] References Cited

U.S. PATENT DOCUMENTS

| | | |
|---|---|---|
| 3,699,649 | 10/1972 | McWilliams . |
| 4,284,872 | 8/1981 | Graeme . |
| 4,381,441 | 4/1983 | Desmarais et al. . |
| 4,418,466 | 12/1983 | Piedmont et al. ................ 338/195 |
| 4,580,030 | 4/1986 | Takeuchi .................. 219/121.69 |
| 4,626,822 | 12/1986 | Melkeraaen . |
| 4,639,684 | 1/1987 | Laude . |
| 4,647,906 | 3/1987 | Naylor et al. . |
| 4,687,622 | 8/1987 | Longden ........................ 376/254 |
| 4,774,492 | 9/1988 | Shier ............................. 219/121.69 |
| 4,891,632 | 1/1990 | Chang ............................. 345/165 |
| 4,947,169 | 8/1990 | Smith et al. . |
| 4,951,034 | 8/1990 | Mazzone et al. . |
| 4,975,386 | 12/1990 | Rao . |
| 5,046,859 | 9/1991 | Yamaguchi . |
| 5,081,439 | 1/1992 | Natzle et al. . |
| 5,124,596 | 6/1992 | Warcer . |
| 5,138,280 | 8/1992 | Gingrich et al. . |

Primary Examiner—Bruce A. Reynolds
Assistant Examiner—Gregory L. Mills
Attorney, Agent, or Firm—Guy W. Shoup; Patrick T. Bever

[57] ABSTRACT

A method for producing opto-electronic devices, such as opto-mechanical mouse devices, which includes adjusting a detector signal after a detector and emitter are connected to the remaining circuitry associated with the opto-electronic device. The method also includes a rough adjustment step wherein a the detector signal is adjusted to a predetermined output voltage, and a fine adjustment step wherein an encoder is rotated between the emitter and the detector, and the circuit is adjusted such that the duty cycle of a comparator is within a desired range.

3 Claims, 10 Drawing Sheets

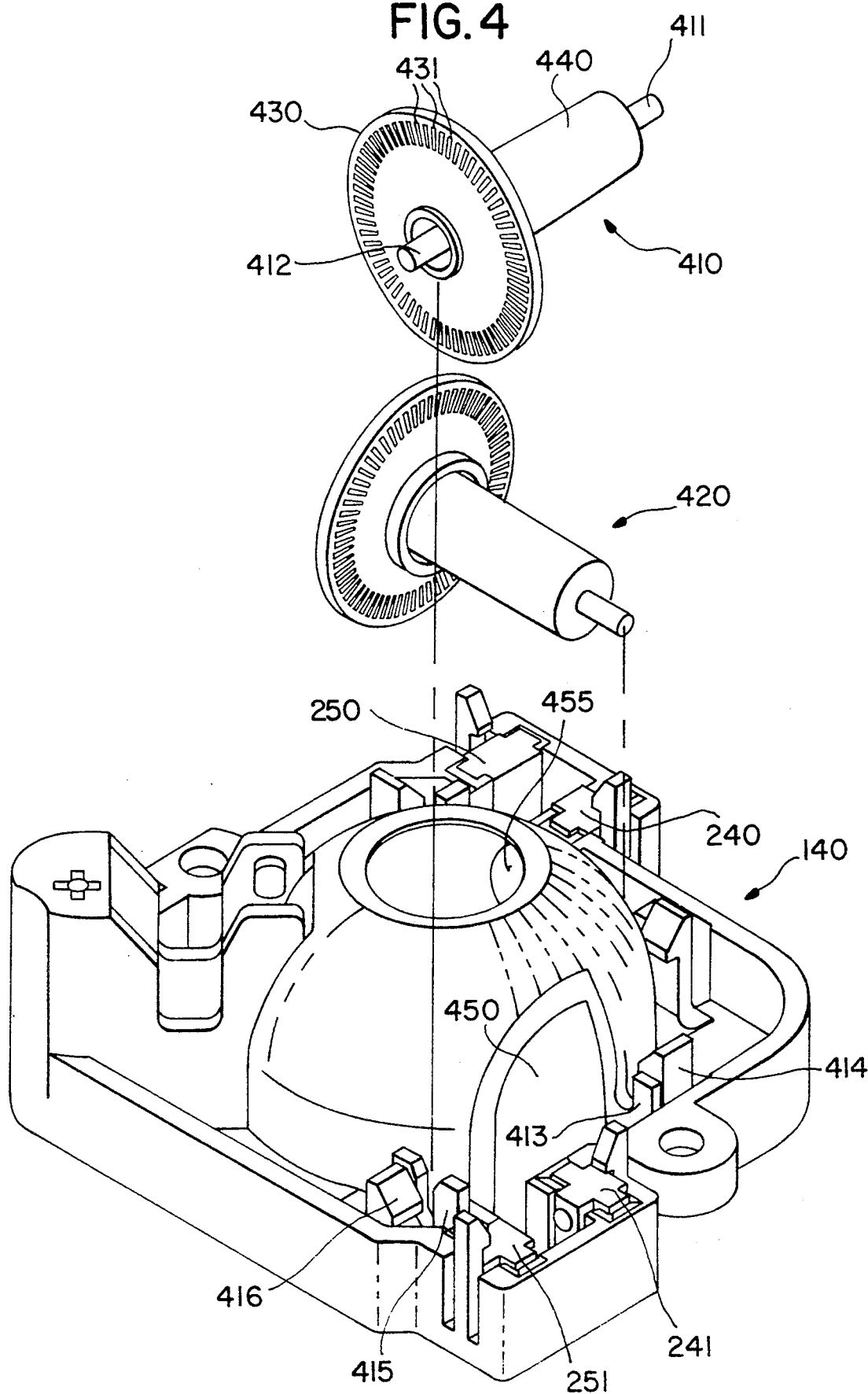

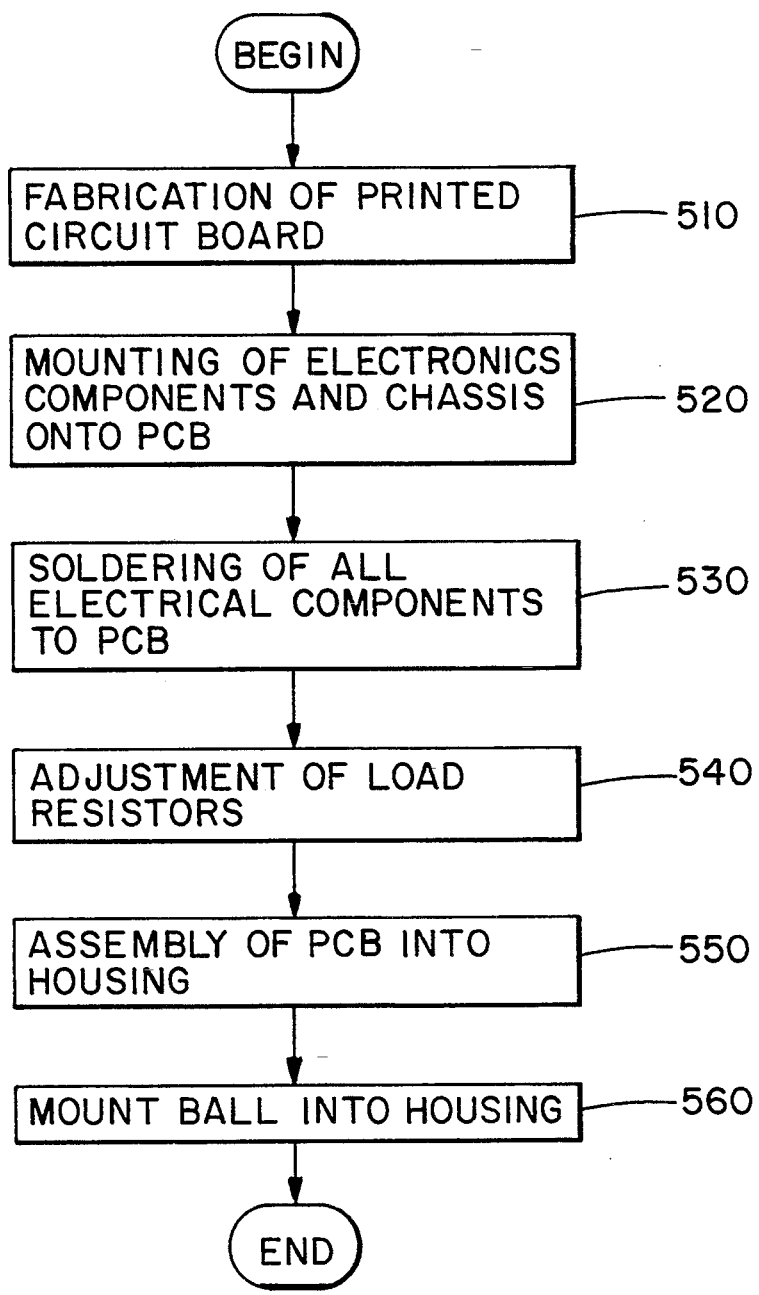

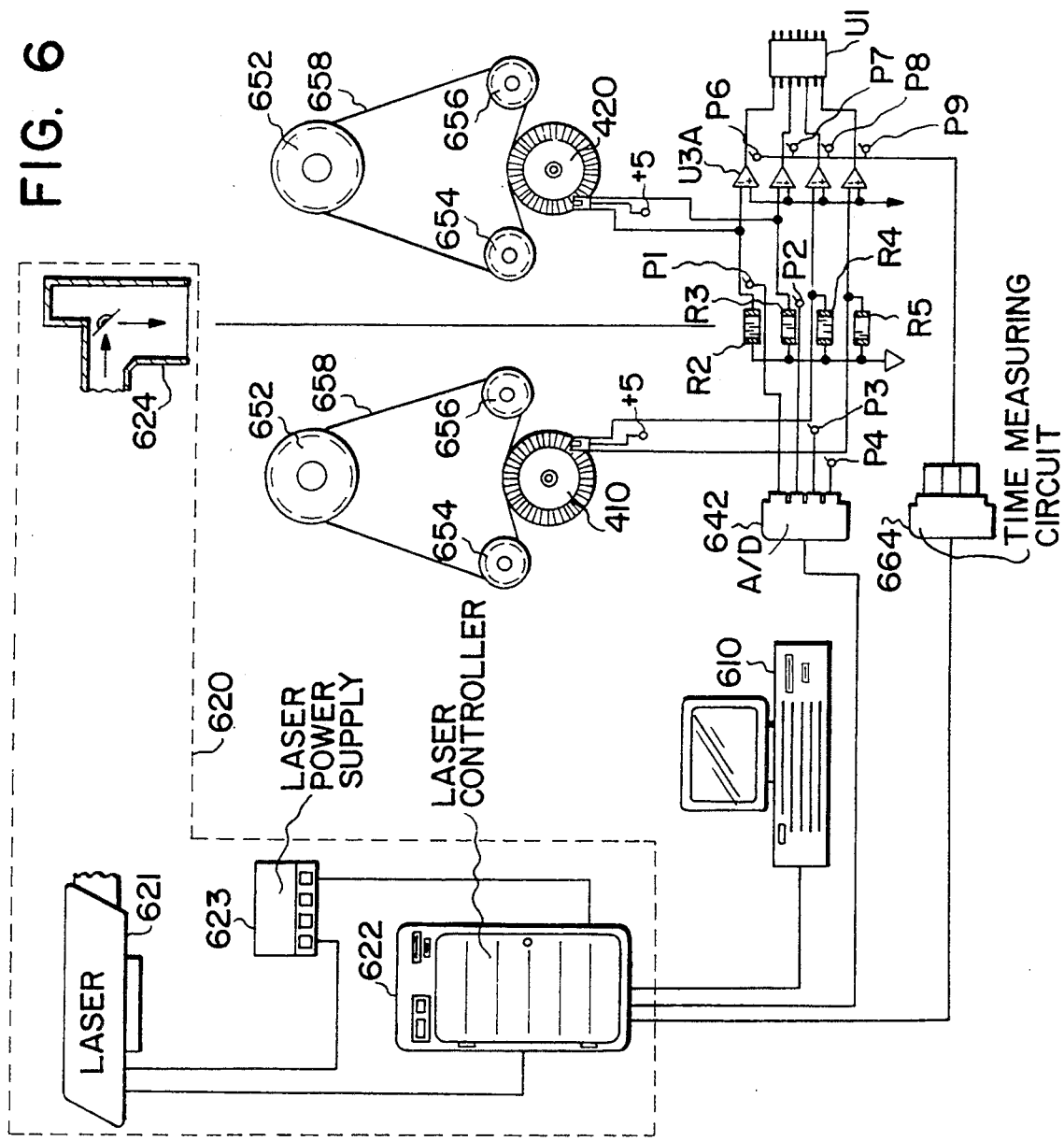

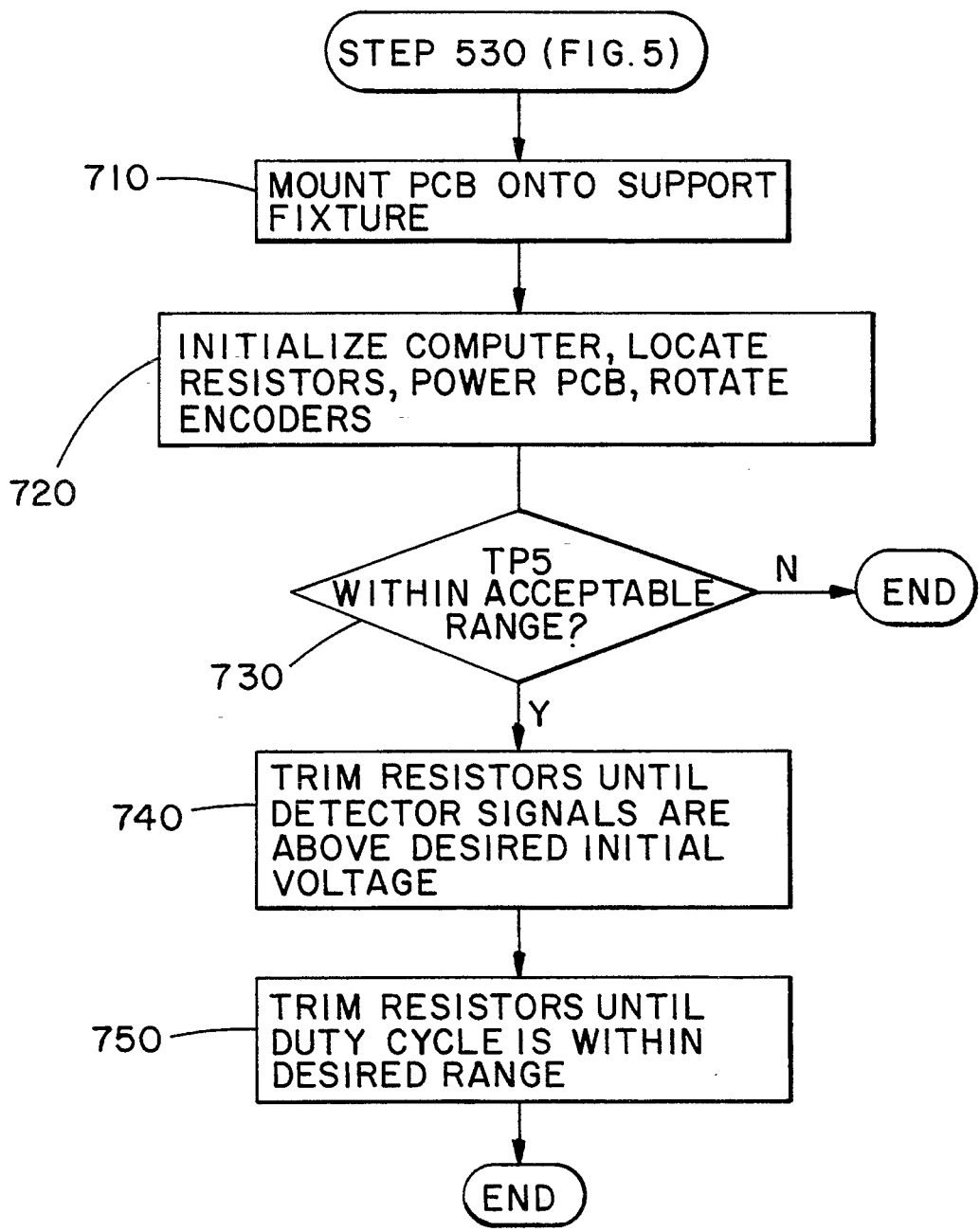

METHOD FOR PRODUCING OPTO-ELECTRONIC CIRCUIT USING LASER-TRIMMING DEVICE

BACKGROUND OF THE INVENTION

1. Field of the Invention

The present invention is related to the production of opto-electronic devices and more particularly to a method for producing an opto-electronic device by adjusting the resistance of load resistors after electrically connecting all components associated with the opto-electronic device.

2. Description of the Prior Art

The term "opto-electronics" refers to a general area of technology related to devices which emit, detect, or emit and detect electromagnetic radiation in the visible, infrared, or ultraviolet spectral regions of the frequency spectrum.

FIG. 8 illustrates an opto-electronic circuit used, for example, in an opto-mechanical mouse. The opto-electronic circuit includes a light emitting diode (LED) 810, a phototransistor 820, an encoder 830 located between the LED 810 and the phototransistor 820, a comparator 840 and a power supply 850. The anode of the LED 810 is connected to the power supply 850 and the cathode is connected to ground through an emitter load resistor 815. The collector of the phototransistor 820 is connected to the power supply 850 and the emitter is connected to the non-inverting input of the comparator 840. The emitter of the phototransistor 820 is also connected to ground through a detector load resistor 825. Finally, a reference signal is provided to the inverting input of phototransistor 840 through a voltage divider 860 formed by a first resistor 861 and a second resistor 862.

In operation, displacement of the opto-mechanical mouse on a flat surface results in rotation of the encoder 830. As the encoder 830 rotates, a slotted disk portion of the encoder 830 allows pulses of light to strike the base of the phototransistor 820. The light pulses cause the phototransistor 820 to turn on and off, thereby applying a series of high and low detector signals to the non-inverting input terminal of the comparator 840. Each time the amplitude of the detector signal rises above the reference signal, which is applied to the inverting input terminal, the comparator 840 generates a high OUTPUT signal which is transmitted to, for instance, a host computer (not shown) for controlling the position of a cursor on the viewing screen of a video terminal.

FIG. 9(a) illustrates an ideal detector signal 910, which is output from the phototransistor 820 (FIG. 8), and reference signal 920. The detector signal 910 is a sinusoid produced by a constant rotation of the encoder 830 (FIG. 8). The reference signal 920 has a constant amplitude which is midway between the peak amplitude levels of the ideal detector signal 910. FIG. 9(b) illustrates an ideal comparator output signal 930 generated in response to the ideal detector signal 910 and reference signal 920. As indicated, the ideal comparator output signal 930 has a duty cycle of 50%, thereby giving the host computer a maximum amount of time to detect the change of high or low output state. This permits the mouse to be operated at a faster speed than if the duty cycle were above or below 50%.

FIG. 9(a) also shows a non-ideal detector signal 950 having an average voltage which is shifted above the reference signal 920. This shift can be caused by, for example, the amount of light emitted by the LED 810, the sensitivity of the phototransistor 820, the resistance of the detector load resistor 825, the alignment of the LED 810 and phototransistor 820, and the position and quality of the encoder 830. For example, the light output from a single LED model can vary 10:1, and the sensitivity of a single phototransistor model can vary 4:1. In addition, resistors typically vary by 5% of their listed resistance. Any performance variations of these elements will cause the average voltage to shift up (or down) relative to the reference voltage, as indicated by the non-ideal detector signal 950. FIG. 9(c) shows a comparator output signal 960 which is generated in response to the non-ideal detector signal 950 and the reference signal 920. As indicated, the duty cycle of the comparator output signal 960 is substantially higher than the ideal 50% duty cycle of FIG. 9(b). This limits the operating speed of the mouse to a slower speed than if the duty cycle were 50%.

One prior art method attempts to produce mouse devices with ideal duty cycles by testing and matching compatible components prior to assembly onto a mouse device. The prior art method begins by "bench testing" each emitter and detector, and sorting the emitters and detectors by performance characteristics. For example, an emitter may be rated as a "low output" emitter and stored with other "low output" emitters in a bin. Likewise, "high output" emitters, "low sensitivity" detectors and "high sensitivity" detectors may also be stored together in their respective bins. Next, each emitter is matched with a detector having compatible characteristics. For example, an emitter from the "high output" bin is matched with a detector from the "low sensitivity" bin. Similarly, an emitter from a "low output" bin is matched with a detector from a "high sensitivity" bin. A detector load resistor is then selected to produce a desired detector signal level. The matched emitter and detector, along with a selected detector load resistor, are then connected to a production assembly, along with other electronic components associated with the mouse device. Finally, the encoder 830 is connected to the circuit board, along with other mechanisms associated with the mouse device, and the circuit board is mounted in a housing.

A problem with the above-described prior art method is that the matched emitter, detector and detector load resistor do not always produce the desired detector signal after they are assembled with other electronic and mechanical components associated with mouse devices. Because the emitter, detector and load resistor are electrically tested independently from the other components of the opto-electronic circuit, variations of the detector signal and reference signal caused by the other components cannot be accounted for, thereby resulting in detector signal shifts, as indicated by the non-ideal detector signal 950, which is shown in FIG. 9(a). Further, production variations of the encoders may cause shift from the ideal duty cycle shown in FIG. 9(b). For example, variations in the widths of the slots may effect the amount of light received by the phototransistor. Therefore, because the prior art method tests the detector signal level prior to complete assembly of the circuitry and the encoder, opto-electronic devices produced using the prior art method typically exhibit non-ideal duty cycles.

Another problem with the prior art method is that the process of sorting and matching emitters and detectors is laborious and expensive.

SUMMARY OF THE INVENTION

The present invention is directed to a method for producing opto-electronic mice which overcomes the limitations of prior art production methods by adjusting an adjustable resistor after the opto-electronic device is substantially assembled, thereby producing a comparator duty cycle which is reliably uniform for all produced devices. The method also reduces production expenses associated with testing and matching emitters and detectors, and maximizes performance characteristics.

In accordance with one embodiment of the present invention, a method is provided for producing an opto-electronic device including a conductor for transmitting a detector signal to a comparator and one or more adjustable detector load resistors. The method includes measuring the detector signal transmitted on the conductor, and adjusting the resistance of the adjustable detector load resistor in response to the measured detector signal until the detector signal is within a predetermined range.

In accordance with a second embodiment of the present invention, a method is provided for producing an opto-electronic device including a conductor for transmitting a detector signal to a comparator and one or more adjustable detector load resistors, the comparator generating a comparator output signal in response to the detector signal. The method includes rotating an encoder adjacent the detector at a constant speed, measuring the comparator signal to determine the duty cycle, and adjusting the adjustable detector load resistors until the duty cycle of the comparator is within a predetermined range.

BRIEF DESCRIPTION OF THE DRAWINGS

These and other features, aspects, and advantages of the present invention will become better understood with regard to the following description, appended claims, and accompanying drawings where:

FIG. 4 is an exploded perspective showing the position of encoders on the chassis:

FIG. 5 shows a flow diagram indicating the production process in accordance with the present invention;

FIG. 6 shows a laser trimming device used in accordance with the present invention;

FIG. 7 shows a flow chart indicating the testing and adjusting step of FIG. 5;

DESCRIPTION OF THE PREFERRED EMBODIMENT

Definitions

As used in the present application, the term "opto-electronic circuit" refers to a circuit which includes an electro-magnetic radiation ("e/m") emitter, an e/m detector and a comparator. Further, an "opto-electronic device" refers to a device including an opto-electronic circuit. Finally, an "opto-mechanical mouse" refers to a mouse-type computer input/output opto-electronic device.

Opto-Mechanical Mouse

Figure 1:
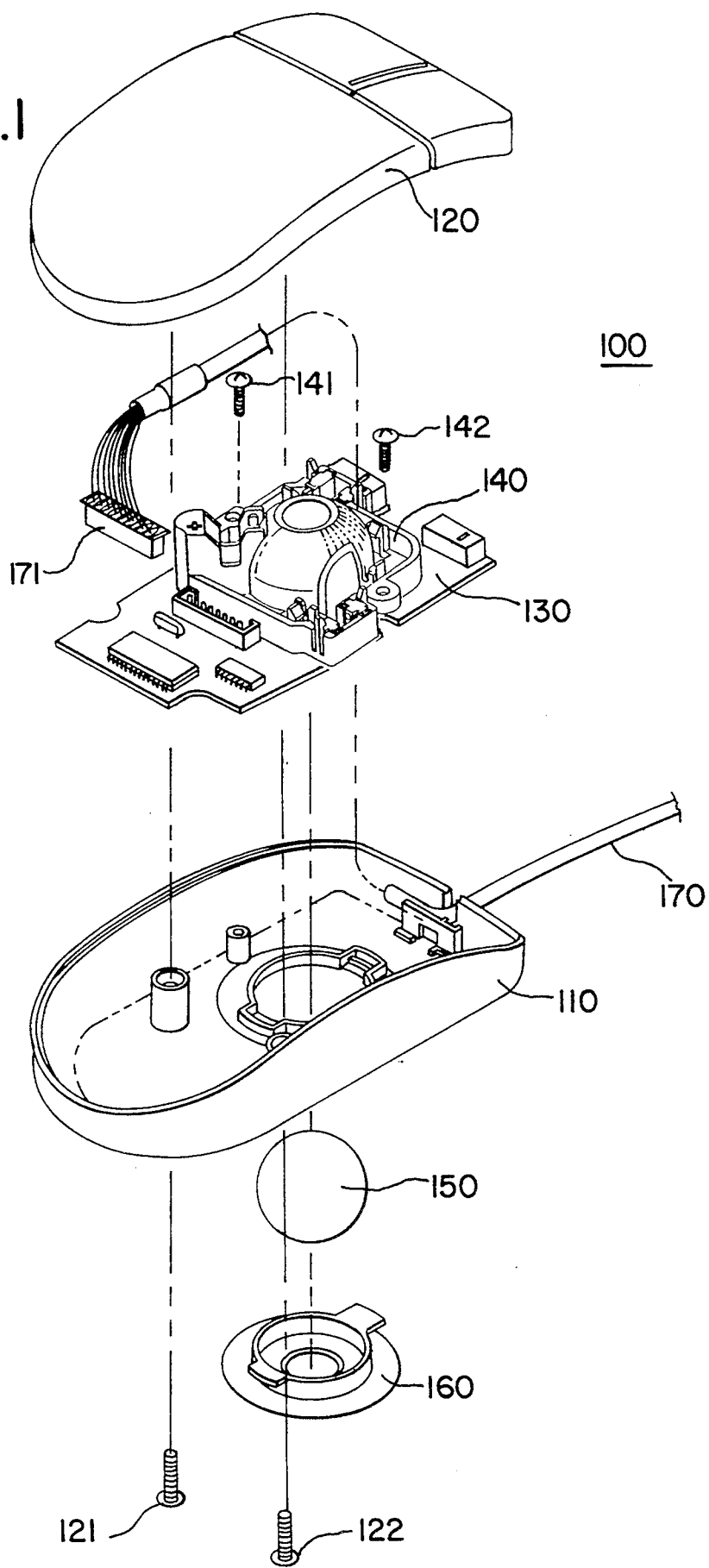
FIG. 1 shows an exploded view of an opto-electronic mouse produced in accordance with the present invention.
Figure 2:
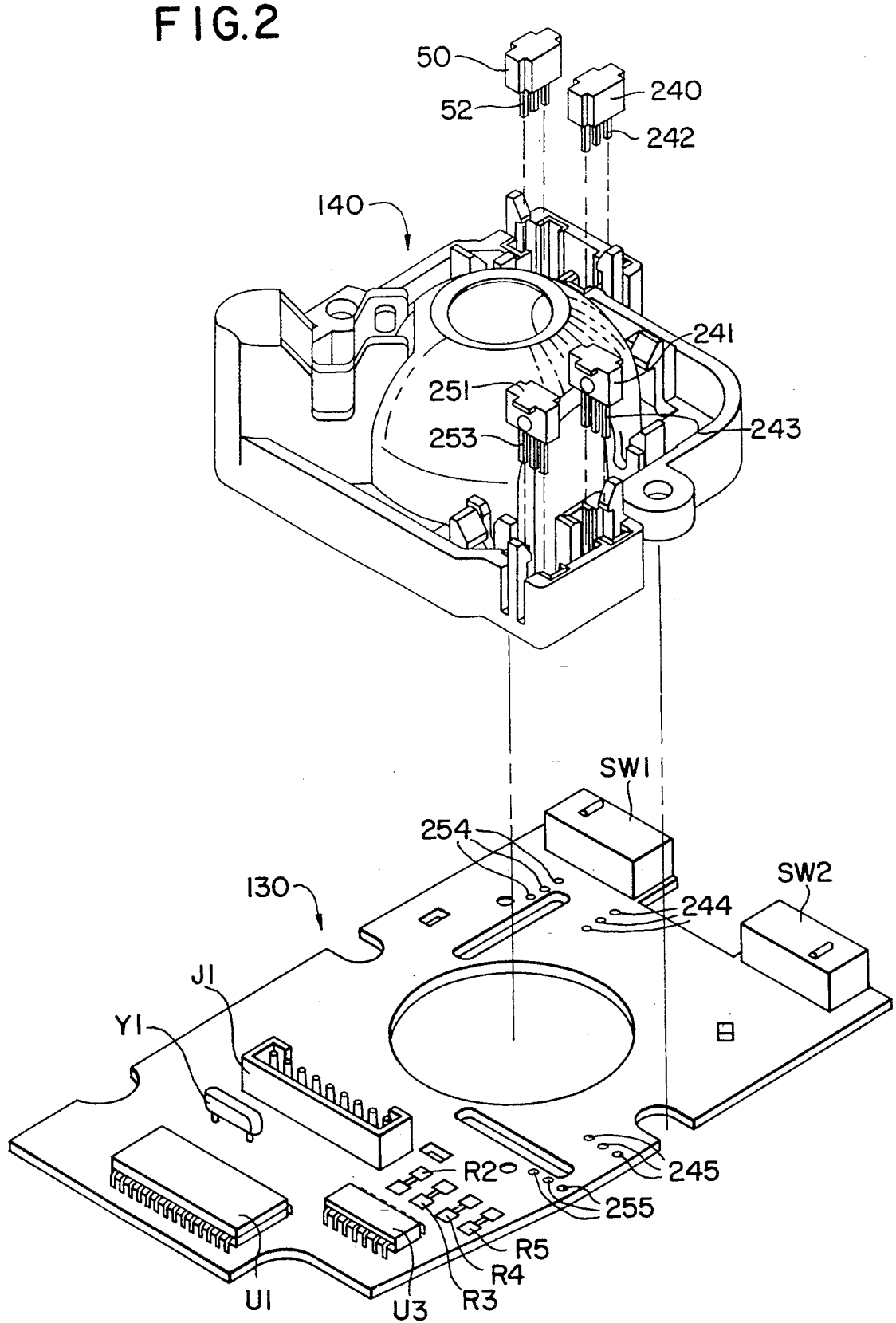
FIG. 2 shows an exploded view of a printed circuit board and chassis of FIG. 1.

FIGS. 1 and 2 show an opto-mechanical mouse 100 incorporating trimmable resistors in accordance with the present invention. The opto-mechanical mouse 100 is described in additional detail in co-pending, commonly assigned U.S. application Ser. No. 08/071,437, entitled "Opto-Mechanical Mouse", filed on the 2nd day of Jun., 1993, which is incorporated herein by reference in its entirety.

As shown in FIG. 1, an opto-mechanical mouse 100 includes a housing comprised of a base 110, a cover 120 fixedly connected to the base 110 by fasteners 121 and 122, and a ball retaining cap 160 which is connected to the base 110. A printed circuit board (PCB) 130 is located on mounts formed on the base 110. A chassis 140 is snap coupled to the PCB 130 and is fixedly connected to the base 110 by fasteners 141 and 142. A ball 150 is rotatably housed in the chassis 140 and retained in the housing by the ball retaining cap 160. Finally, a cable 170, having a first end connected to a host computer (not shown), is connected to the PCB 130 by a plug 171.

PCB Description

FIG. 2 shows an exploded view of the PCB 130 and the chassis 140. Connected to the PCB 130 are a microprocessor integrated circuit ("IC") U1, a comparator IC U3, a crystal Y1, a cable connector socket J1, first and second switches SW1 and SW2, and a plurality of laser trimmable (adjustable) detector load resistors R2, R3, R4 and R5. Emitter units 240 and 241 are mounted on chassis 140, each having a plurality of leads 242 and 243 extending through a lower surface of the chassis 140 and being inserted into holes 244 and 245 formed in the PCB 130. Similarly, detector units 250 and 251 are mounted on chassis 140, each having a plurality of leads 252 and 253 extending through a lower surface of the chassis 140 and being inserted into the holes 254 and 255 formed in the PCB 130. Additional holes and slots are formed in the PCB 130 for receiving the chassis 140. The holes and slots are described in greater detail in the above-mentioned copending U.S. application Ser. No. 08/071,437. Finally, a circuit pattern (not shown) is formed on the surfaces of the PCB 130 for providing electrical connection paths between the abovementioned electrical components. The circuit connection paths are disclosed in the circuit diagram shown in Figs. 3A and 3B.

Figure 3A:
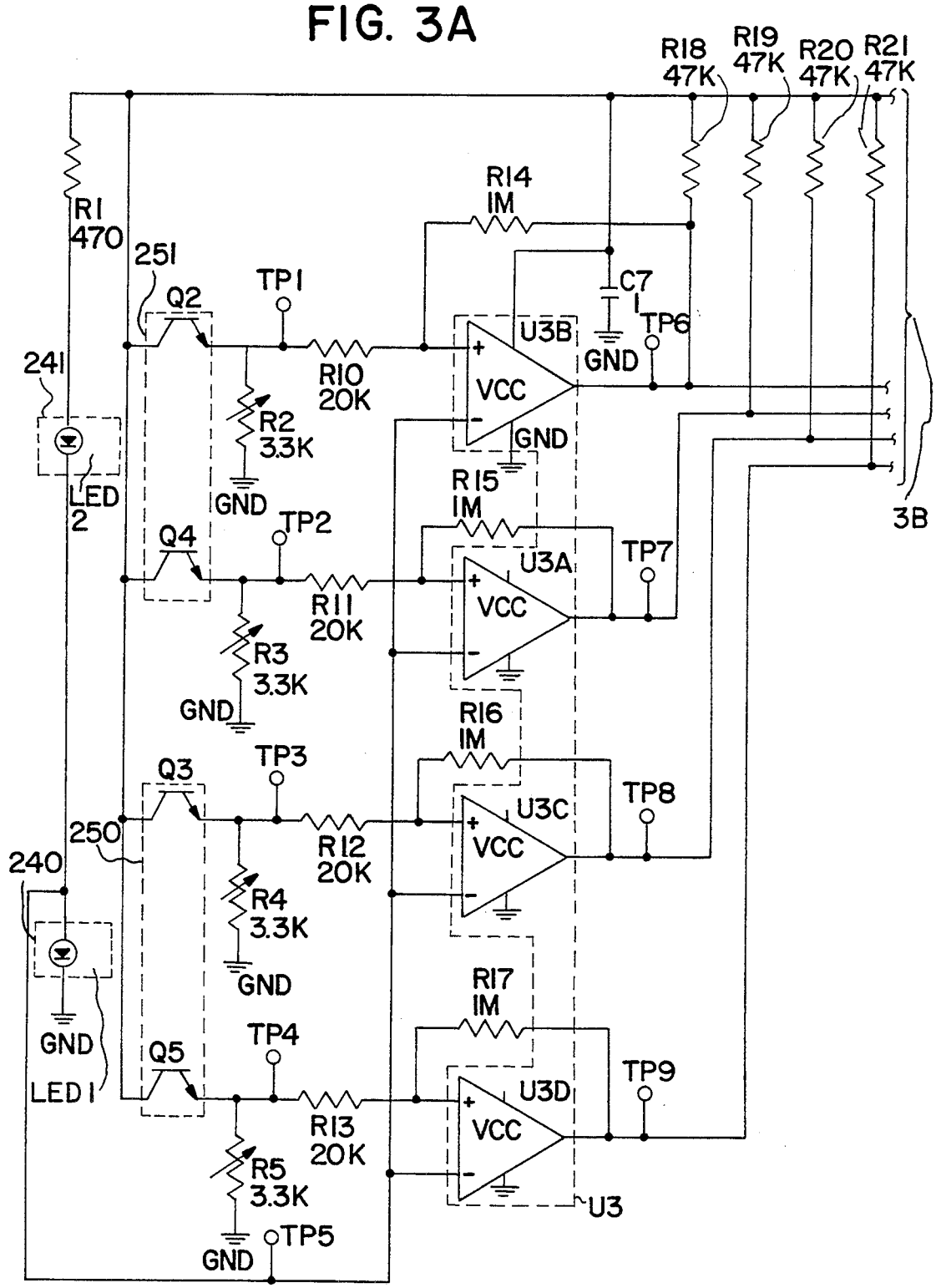
FIGS. 3A and 3B show a wiring diagram of an opto-electronic mouse incorporating the present invention.
Figure 3B:
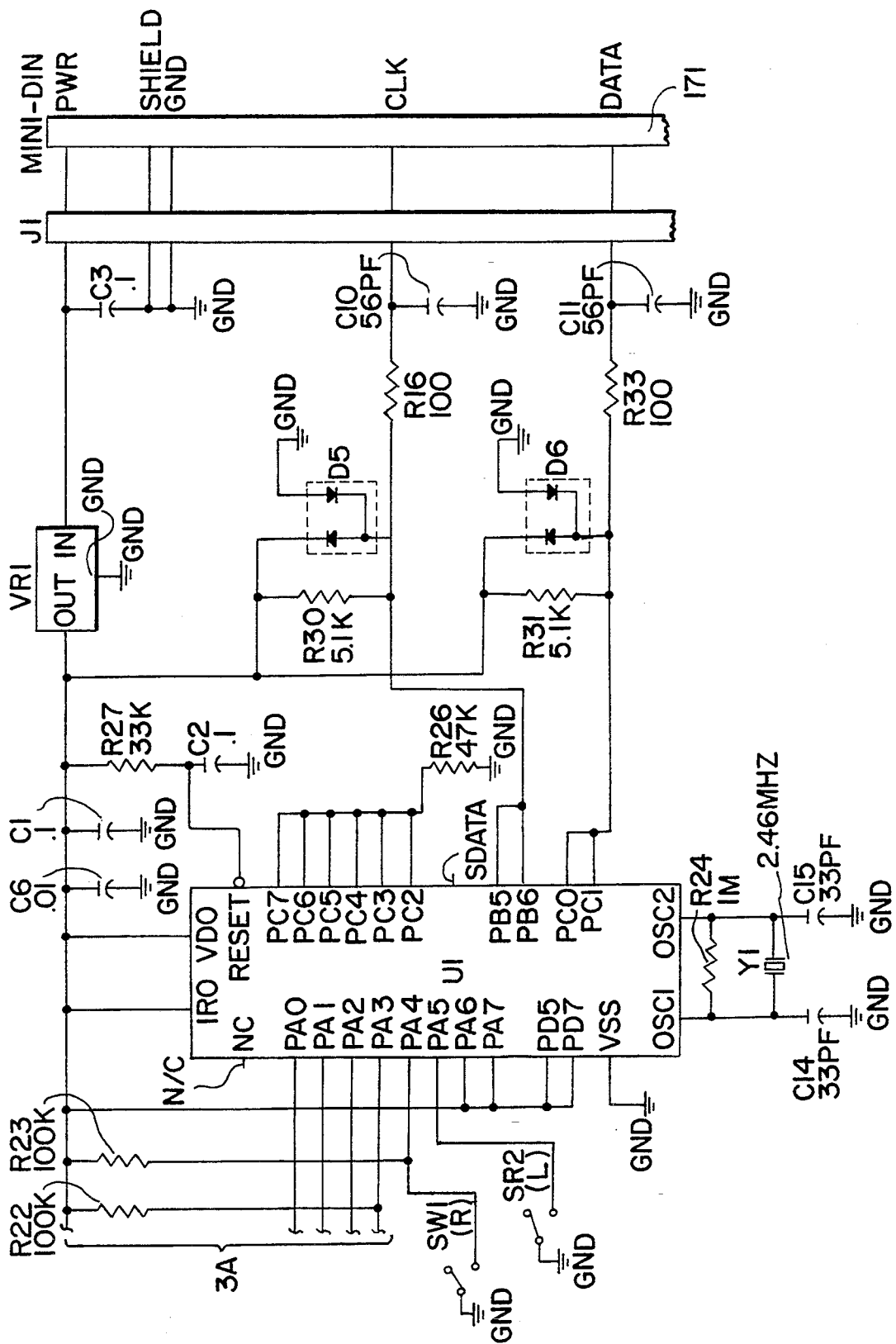
Figure 8:
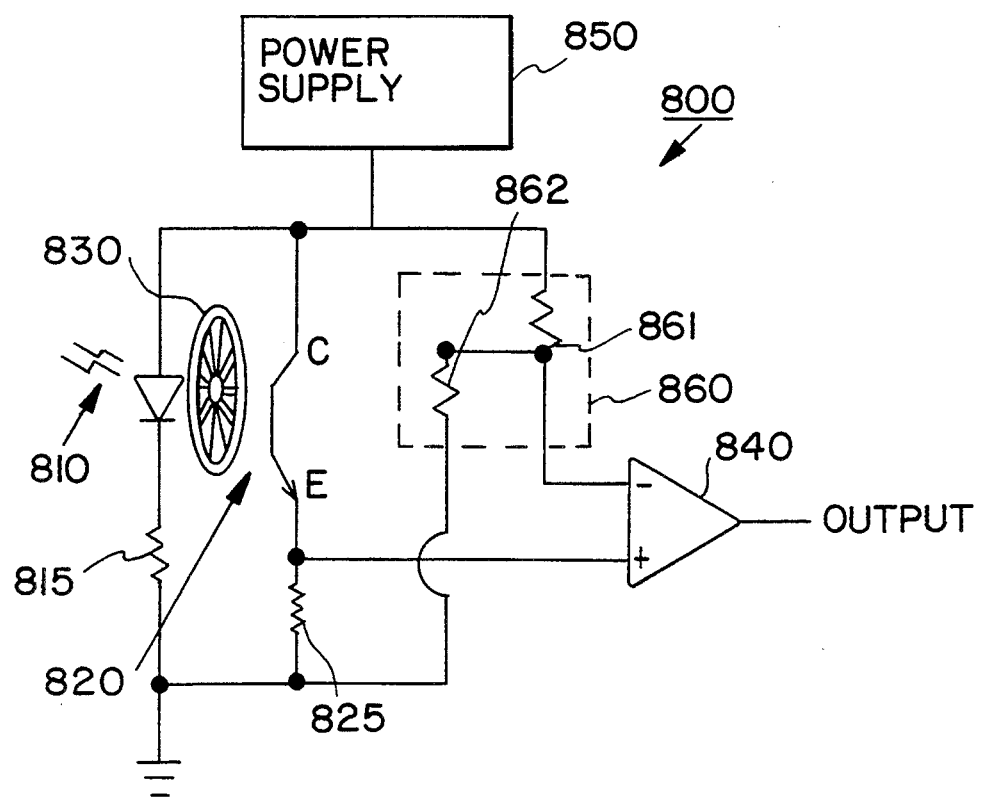
FIG. 8 shows a prior art simplified circuit diagram of an opto-electronic device.
Figure 9A:
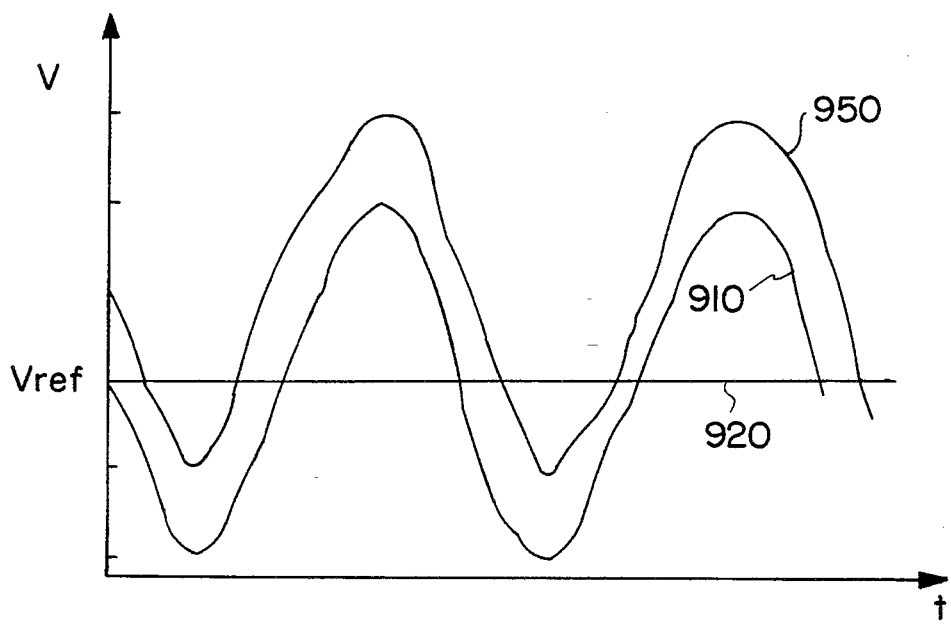
FIG. 9(a) shows ideal and non-ideal detector signals.
Figure 9B:
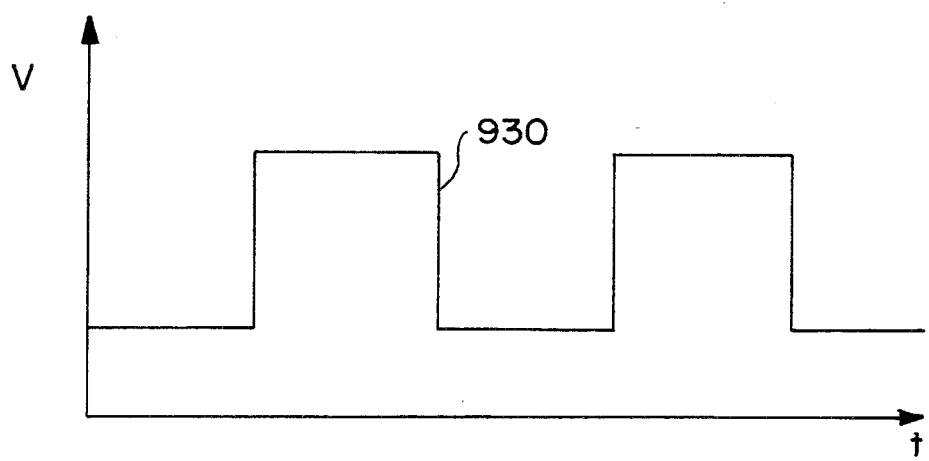
FIGS. 9(b) and 9(c) show ideal and non-ideal comparator output signals.
Figure 9C:
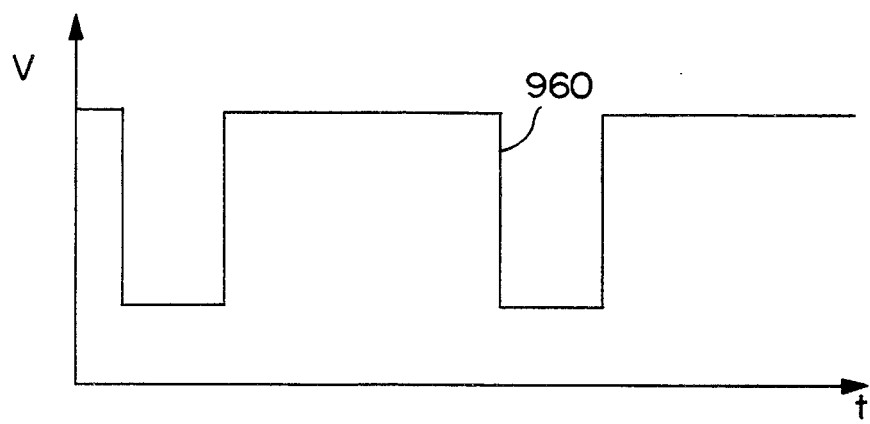

Circuit Diagram (FIGS. 3A and 3B)

FIGS. 3A and 3B show a circuit diagram the PCB 130 and associated circuitry as configured to operate in association with an IBM PS/2 computer or equivalent.

As shown in FIG. 3B, the plug 171 of the cable 170 connects to the socket J1, which is connected to the PCB 130. The cable 170 includes five lines: PWR (power), SHIELD, GND (ground), CLK (clock) and DATA.

The PWR line provides a 5.0 volt power signal from a host computer (not shown) and is connected through a capacitor C3 to the SHIELD line and the GND line. The capacitor C3 is selected to remove transients from the power signal. The PWR line is also connected to an input terminal of a voltage regulator VR1.

The voltage regulator VR1 receives the 5.0 volt power signal from the PWR line and generates a 4.0 volt DC signal at its output terminal which is provided to the remaining circuitry associated with the PCB 130. A preferred voltage regulator VR1 is a model number JRC7201U40 available from New Japan Radio Co., Ltd., Tokyo, Japan.

The SHIELD line is connected to the shield of the coaxial cable 170 and is connected through the capacitor C3 to the PWR line.

The CLK line provides a clock signal from the host computer which is connected to the clock-in terminal (PB5) and the clock-out terminal (PB6) of microprocessor U1. The CLK line is connected to ground through a capacitor C10 which is selected to remove transients from the clock signal. The CLK line is also connected to the output terminal of voltage regulator VR1 through a resistor R30 connected in parallel with a diode pair D5. The resistor R30 is selected to maintain the CLK line at a minimum voltage of 3.5 volts. The diode pair D5 suppresses transients which are 0.7 volts above the output of VR1 and 0.7 volts below ground. The clock signal is used to synchronize data output signals from the microprocessor U1. The clock signal is typically 0 to 5 volts at 1200 Hz.

The DATA line transmits a input and output data signals to and from the microprocessor U1 and is connected to the data-in terminal (PC0) and the data-out terminal (PC1) of the microprocessor U1. The input data signals sent to the microprocessor U1 from an external computer (not shown) include reset, resend, set default, disable, enable, set sampling rate, read device type, set remote mode, set wrap mode, reset wrap mode, set scaling, reset scaling and set resolution. The DATA line is connected to ground through a capacitor C11 which is selected to remove transients from the data signal. The DATA line is also connected to the output terminal of voltage regulator VR1 through a resistor R31 connected in parallel with a diode pair D6. The resistor R31 is selected to maintain the DATA line at a minimum voltage of 3.5 volts. The diode pair D6 suppresses transients which are 0.7 volts above the output of VR1 and 0.7 volts below ground. The data signal is transmitted on the DATA line to the host computer and is used to control the position of a cursor on a video terminal and to indicate the actuation state of the switches SW1 and SW2.

A pair of capacitors C1 and C6 are connected between the output terminal of the voltage regulator VR1 and ground to remove transients from the source voltage signal, thereby further assuring that a consistent signal is transmitted to the circuitry associated with the PCB 130.

The microprocessor U1 is preferably a model number 68HC05P1 microprocessor available from Motorola, Inc. of Schamberg, Ill. The operating parameters of a 68HC05P1 microprocessor are taught in "Motorola Microprocessor, Microcontroller and Peripheral Data" Vol II Series A, 1988, which is incorporated herein by reference.

The source voltage generated by voltage regulator VR1 is applied directly to the IRQ, VDD, PA6, PA7, PD5 and PD7 terminals of the microprocessor U1, thereby maintaining a "high" signal on these terminals whenever power is supplied to the opto-mechanical mouse 200 from the host computer. In addition, the source voltage is applied to the inverting RESET terminal of the microprocessor U1 through a resistor/capacitor (RC) network including resistor R27 and capacitor C2. The RC network R27/C2 applies a "low" reset signal to the microprocessor U1 upon start-up and a "high" reset signal thereafter. The capacitor C2 is connected between the resistor R27 to provide the RC time constant to generate the reset pulse.

The remaining terminals of the microprocessor U1 are either connected to ground or allowed to float. The output terminal SDATA is floating. Terminal VSS is connected directly to ground, and terminals PC7, PC6, PC5, PC4, PC3 and PC2 are connected to ground through a 47 KΩ resistor R26.

Switches SW1 and SW2 are normally-open push-button switches, each having a fixed terminal connected to the PA4 and PA5 input terminals, respectively, of microprocessor U1. The source voltage generated by voltage regulator VR1 is connected to the fixed terminals of switches SW1 and SW2 and to the PA4 and PA5 input terminals through pull-up resistors R22 and R23. A "high" signal is maintained at the PA4 and PA5 input terminals until either or both of the switches SW1 and SW2 are actuated by a user. When actuated, switches SW1 and SW2 connect the PA4 and PA5 input terminals, respectively, to ground, thus producing a "low" signal.

The crystal Y1 is connected in parallel across terminals OSC1 and OSC2 along with a resistor R24. In addition, each terminal of the crystal Y1 is connected to ground through capacitors C14 and C15, respectively. The crystal Y1, resistor R24 and capacitors C14 and C15 are selected to produce a 1.23 MHz internal clock signal in the microprocessor U1.

The crystal Y1 is connected in parallel across terminals OSC1 and OSC2 along with a resistor R24. In addition, each terminal of the crystal Y1 is connected to ground through capacitors C14 and C15, respectively. The crystal Y1, resistor R24 and capacitors C14 and C15 are selected to produce a 1.23 MHz internal clock signal to the microprocessor U1.

Referring to FIG. 3A, the source voltage from voltage regulator VR1 is connected through a resistor R1 to the anode of LED2, which is disposed within emitter unit 241. The cathode of LED2 is connected to the anode of LED1, which is disposed within emitter unit 240. The cathode of LED1 is connected to ground. The cathode of LED2 is also connected to the inverting inputs of four comparators U3A, U3B, U3C and U3D, all of which located in comparator IC U3. Suitable LEDs for practicing the present invention are provided by Siemens of Germany under LED die number FU94K.

The source voltage is also connected to the collectors of phototransistors Q2 and Q4, which are mounted in the detector unit 251, and to the collectors of phototransistors Q3 and Q5, which are mounted in the detector unit 250. The emitters of phototransistors Q2 and Q4 are connected via conductive segments 301 and 302 to the non-inverting inputs of comparators U3A and U3B through resistors R10 and R11, respectively, and to ground through the adjustable detector load resistors R2 and R3, respectively. The emitters of phototransistors Q3 and Q5 are connected via conductive segments 303 and 304 to the non-inverting inputs of comparators U3C and U3D through resistors R12 and R13, respectively, and to ground through the adjustable detector load resistors R4 and R5, respectively.

Each resistor pair consisting of resistor R10 and adjustable resistor R2, resistor R11 and adjustable resistor R3, resistor R12 and adjustable resistor R4, and resistor R13 and adjustable resistor R5, is selected and adjusted to apply a detector signal to the non-inverting input of the comparators U3A through U3D, respectively. Each detector signal has an average amplitude preferably within the range of 0.3 to 1.2 volts.

Comparator IC U3 is preferably a model NJM2901 available from New Japan Radio Co., Ltd., Tokyo, Japan. The operating parameters of a model NJM2901 comparator IC are described in the "New Japan Radio Company Semiconductor Data Book, Bipolar I.C.", 1991, which is incorporated herein by reference. The VCC input terminal of the comparator IC U3 is connected to receive the source voltage provided by voltage regulator VR1, and also connected to ground through a capacitor C7 which is selected to filter transients. For circuit simplification, the VCC connection is illustrated only in U3B. The output terminal of comparator U3B is connected to the source voltage through a pull-up resistor R18 and is fed-back to the non-inverting input through resistor R14 which, in combination with resistor R10, forms a Schmitt trigger. Similarly, the output terminal of comparator U3A is connected to the source voltage through a pull-up resistor R19 and is fed-back to its non-inverting input through resistor R15. Likewise, the output terminal of comparator U3C is connected to the source voltage through a pull-up resistor R20 and is fed back to its non-inverting input through resistor R16, and the output terminal of comparator U3D is connected to the source voltage through a pull-up resistor R21 and is fed back to its non-inverting input through resistor R17. The above-mentioned resistors are selected such that the Schmitt triggers provide a hysteresis effect, preferably in the range of 1 to 5%.

FIG. 4 shows an exploded perspective view of the chassis 140 indicating the position of a first encoder 410 between the emitter unit 241 and the detector unit 251, and the position of a second encoder 420 between the emitter unit 240 and the detector unit 250. The first encoder 410 includes first and second journals 411 and 412, the first journal 411 being rotatably supported on the first encoder mount 413 and secured by a first encoder latch 414, and the second journal 412 being rotatably supported on the second encoder mount 415 and secured by a second encoder latch 416. The first encoder 410 includes a code disk 430 located adjacent the first journal 411, and a roller portion 440 located adjacent the second journal 412. The code disk 430 is formed with a plurality of elongated openings (slots) 431 which extend radially with respect to the axis formed by the first and second journals 411 and 412. The second encoder 420 is similarly constructed and mounted between the emitter unit 241 and the detector unit 251.

When the opto-mechanical mouse 100 is fully assembled, the ball 150 (FIG. 1) is pressed against the roller portions 440 of the first and second encoders through openings 450 and 455 formed in a ball housing 460 of the chassis 140. A portion of the ball 150 also extends through a hole in the ball retaining member 160 (FIG. 1). When the opto-mechanical mouse is moved over a flat surface, the X- and Y-direction movements of the mouse cause the ball 150 to rotate in directions which are transferred to the roller portions 440 of the first and second encoders 410 and 420. The rotation of the first and second encoders 410 and 420 causes the code disks 430 to rotate, thereby allowing intermittent pulses of e/m radiation emitted by the emitters LED1 and LED2 of the first and second emitter units 240 and 241 to pass through the openings 431 formed in the code disk 430 and to strike the detectors Q2 through Q5 located on first and second detector units 250 and 251. As the e/m radiation pulses strike the detectors, the detectors generate detector currents which are applied to the PA0, PA1, PA2 and PA3 terminals of the microprocessor U1. The microprocessor U1 then converts the detector signals into data signals which are sent to the host computer over the DATA line. Note that the direction of rotation of the first and second encoders 410 and 420 is determined by the phase difference between the detector signals generated by phototransistors Q2 and Q4, and between the detector signals generated by phototransistors Q3 and Q5, respectively.

Similarly, activation of the switches SW1 and SW2 by a user causes low switch signals to be applied to the PA4 and PA5 terminals of the microprocessor U1, which in turn generates data signals on the DATA line indicating the event.

Additional information regarding the operation of the above-identified opto-mechanical mouse 100 is provided in the above-mentioned co-pending U.S. application Ser. No. 08/071,437, and also in copending, commonly assigned U.S. application Ser. No. 08/070,584, entitled "TEMPERATURE COMPENSATED OPTO-ELECTRONIC CIRCUIT AND MOUSE USING SAME" filed on the 2nd day of Jun., 1993, which is also incorporated herein by reference in its entirety.

Assembly and Adjustment

FIG. 5 shows a simplified flow chart indicating the assembly and adjustment process associated with the present invention.

Referring to FIG. 5, in step 510 the PCB 130 is fabricated with conductive patterns to produce the connections shown in FIGS. 3A and 3B, and the slots and holes shown in FIG. 2 are formed. In step 520, the electrical components, described above, are mounted onto the PCB 130, and the chassis 140, including the first and second emitter units 240 and 241 and the first and second detector units 250 and 251, are mounted onto the PCB 130. In step 530, a wave-soldering process is performed in which the electrical components are soldered to the PCB 130, thereby providing the connections necessary to complete the opto-electrical circuit of FIGS. 3A and 3B. In step 540, the opto-electrical circuit is subjected to a testing process in which the adjustable resistors R2, R3, R4 and R5 are adjusted to produce a desired detector signal, as discussed below. In step 550, the PCB 130 and chassis 140 are mounted onto the base 110 and secured by fasteners 141 and 142, and the cover 120 is connected using fasteners 121 and 122. Finally, in step 560 the ball 150 is inserted into the chassis 140 and the ball cover 160 is connected to the base 110.

In accordance with the above-described process, because the testing step occurs after all of the electrical and mechanical components associated with the opto-electronic circuit are connected to the PCB 130, the detector signal can be adjusted to a desired level while accounting for signal variations caused by other circuitry associated with the opto-electronic device. Further, the prior art step of sorting and matching the emitters and detectors, described in the background section, may be eliminated, provided the range of adjustment of the adjustable resistors is large enough to accommodate all possible combinations of emitters and detectors.

Laser Trimming Apparatus and Method

FIG. 6 shows a simplified block diagram of an apparatus for adjusting an opto-electronic device in accordance with step 540 (FIG. 5) of the present invention. FIG. 7 shows a flow chart showing the adjustment step 540 of FIG. 5 in greater detail.

Referring to FIG. 6, the apparatus for adjusting an opto-electronic device in accordance with the present invention includes a computer 610, a laser assembly 620, a PCB support fixture (not shown), a probe array 640, and an encoder driving mechanism 650.

The computer 610 is preferably an IBM/PC or compatible with a minimum of 8 MB RAM and 100 MB of external storage. The computer must also be equipped with one I/O port for receiving information from the laser controller 622 and transmitting information to the laser controller 622.

The laser assembly 620 includes a laser 621, a laser controller 622, a laser power supply 623 and a beam positioner 624. The preferred components of the laser assembly 620 are available from Chicago Laser Systems of Des Plaines, Ill. The preferred laser controller 622 is sold under model number CLS960. The preferred laser 621 is sold under model number CLS960 and is a 1.2 watt YAG laser. The laser power supply 623 is sold under model number CLS90.

The PCB support fixture (not shown) positions the PCB 130 below the laser assembly 620 during the laser trimming process. PCB holds the PCB in an orientation with respect to the laser assembly 620 such that the laser controller 622 can locate and trim resistors residing on the PCB. The orientation requirements of the laser assembly 620, such as the distance between the PCB and the beam positioner 624, are typically provided by the producer of the laser assembly 620.

The probe array 640 is adjustably connected to the PCB fixture such that the probe array can be electrically connected to the PCB 130 when the PCB 130 is mounted onto the PCB fixture 630. The probe array 640 includes a number of probes P1 through P9 which contact a plurality of predetermined test points indicated as TP1 through TP9 in FIG. 3A. Suitable probes P1 through P9 are available from Accura Probe under model number S2T10(125)3. The probes P1 through P5 are connected to the laser controller 622 through a standard A/D converter 642, and the probes P6 through P9 are connected to the laser controller 622 through a CLS time card 644, which is available from Chicago Laser Systems. In addition, the probe array 640 includes a connector (not shown) for transmitting the PWR, GND and CLK signals to the PCB 130 (see FIG. 3B).

Finally, the encoder driving mechanism 650 is adjustably connected to the PCB fixture 630 such that it can be brought into contact with the encoders 410 and 420 (FIG. 4), as described below. The encoder driving mechanism 650 includes a pair of driving pulleys 652 which are connected to a motor. A pair of idler pulleys 654 and 656 are located adjacent each driving pulley 652, and an elastic band 658 is trained over each driving pulley 652 and its associated idler pulleys 654 and 656. The idler pulleys 654 and 656 are spaced such the elastic band 658 can be brought into contact with and rotate the encoders 410 and 420.

In accordance with the present invention, a method for producing an opto-electronic device includes measuring the detector signals generated by each of the phototransistors Q2 through Q5 (FIG. 3A) and adjusting the adjustable resistors R2 through R5 (FIG. 3A) until the detector signals are within a predetermined range. The next step of adjusting the adjustable resistors is preferably performed using the laser trimming apparatus described above. Also in accordance with the present invention, the duty cycles of comparators U3A through U3D (FIG. 3A) are tested and adjustable resistors R2 through R5 are adjusted until the duty cycles are within a range of 49% to 51% while the encoders 410 and 420 are rotated at a constant speed.

Referring to FIG. 7, the adjusting step 540 (FIG. 5) in accordance with the present invention begins with step 710 in which a PCB 130 is mounted onto a PCB support fixture 630. Note that the PCB 130 includes all electrical components associated with the opto-electronic device and includes the chassis 140 (FIG. 1) along with the encoders 410 and 420. The mounting process is preferably performed using automated "pick-and-place" machinery, but can be performed manually. The mounting process includes positioning the probes P1 through P9 onto the test points TP1 through TP9 (FIG. 3A), connecting power and clock lines, and connecting the encoder driving mechanism 650 against the encoders 410 and 420 as shown in FIG. 6.

Next, in step 720 the computer 610 is initialized to clear all memory locations and to restart the adjusting process. In addition, the laser assembly 620 locates the position of each adjustable resistor R2 through R5 using standard locating procedures available with the laser controller 622. The initialization process includes also applying PWR and CLK signals to the PCB 130, thereby causing LED1 and LED2 (FIG. 3A) to emit light, and to rotate the encoders 410 and 420 at a constant speed.

In step 730, initial measurements are taken from test point TP5. The measurement taken from TP5 indicates that the emitters are functioning properly. If TP5 is not within a desired range, the process is terminated.

In step 740, each of the adjustable resistors R2 through R5 are adjusted until the detector signal is at a desired initial voltage. The probes P1 through P4 read voltage levels at the test points TP1 through TP4 (FIG. 3A), which are transmitted to the computer 610 through the A/D converter 642. The computer 610 then determines whether additional adjustment is necessary by comparing the measured voltage with the desired initial voltage. If the measured voltage is below the desired initial voltage, the laser controller 622 sends control signals to the laser 621 and the beam positioner 624 to trim the adjustable resistors R2 through R5 (FIG. 3A) until the voltage at each test point P1 through P4 is in the desired initial voltage range. The desired initial voltage is selected to assure a comparator output. For example, for a reference voltage Vref of 1.0 to 1.1 volts, the preferred initial voltage 1.6 volts. This initial trimming process is preferably performed using a single laser beam cutting process without remeasurements.

Next, in step 750, measurements are taken from the test points TP6 through TP9 (FIG. 3A), which correspond to the output signals from comparators U3A through U3D. The time measuring circuit 644 (FIG. 6) measures the duty cycle of each comparator U3A through U3D, and transmits this information to the laser controller 622. The laser controller 622 then transmits control signals to the laser 621 and the beam positioner 622 to trim the adjustable resistors R2 through R5 until the duty cycles are within a range of 40% to 60%, and more preferably within a range of 49% and 51%. During this step, it is preferred that several laser beam cut sizes be used to reduce the number of trimming steps and assure successful results. For example, if a measured duty cycle is much lower than 50%, a larger beam cut size is used. As the measured duty cycle approaches 50%, smaller beam cut sizes are used.

Finally, once the duty cycles of the comparators U3A through U3D are within the desired range, the PCB 130 is removed from the fixture (not shown) and assembled into, for example, a mouse device.

The assembly and testing method of the present invention reduces the time and cost associated with producing opto-electronic devices, and provides a method for reliably producing devices having uniform operating characteristics. Although the prior art process of testing and matching emitters and detectors, described above, may be omitted from the present method, the prior art process of testing and matching emitters and detectors may be incorporated into the present method with beneficial results. That is, the amount of time necessary to adjust the resistors may be reduced if the emitters and detectors are matched.

Although the present invention has been described in considerable detail with reference to certain preferred embodiments thereof, other embodiments are possible. For example, the method may be performed using only one of the method steps 740 and 750, described above. In addition, the laser trimming process may be replaced with another suitable resistor adjusting process such as water jet or abrasion, however, in using these methods one must be careful not to allow water or dust to affect the moving parts of the mouse. Therefore, the spirit and scope of the appended claims should not be limited to the description of the preferred embodiments contained herein.

I claim:

1. A method for producing an opto-electronic device including an emitter and a detector, the emitter emitting radiation received by the detector, the detector generating a detector signal in response to the received radiation, the Opto-electronic device further including a conductor for transmitting the detector signal to a comparator and an adjustable resistor connected to the detector, the method comprising the steps of:

electrically connecting at least the emitter, detector, comparator, conductor, and adjustable resistor such that the opto-electronic device is electrically functional;

measuring the detector signal transmitted on the conductor; and adjusting a resistance of the adjustable resistor in response to the measured detector signal until the detector signal is within a predetermined range;

wherein the comparator generates a comparator output signal in response to the detector signal, and the method further comprising the steps of:

after the step of adjusting, rotating an encoder between the emitter and the detector, said encoder having a number of slots which allow the radiation to pass through the slots from the emitter to strike the detector such that the detector generates an alternating detector signal;

measuring the comparator output signal to determine a duty cycle of the comparator; and further adjusting the adjustable resistor until the duty cycle of the comparator is within a second predetermined range.

2. A method of claim 1 wherein the adjustable resistor is a laser trimmable resistor and the step of adjusting the resistance of the adjustable resistor includes trimming the adjustable resistor using a laser.

3. A method of claim 1 wherein the adjustable resistor is a laser trimmable resistor and the steps of adjusting the resistance of the adjustable resistor include trimming the adjustable resistor using a laser.

* * * * *